United States Patent
Ozaki et al.

(10) Patent No.: US 7,964,985 B2
(45) Date of Patent: Jun. 21, 2011

(54) POWER SUPPLY CONTROL DEVICE AND METHOD OF DETECTING ABNORMALITY OF RELAY

(75) Inventors: Masahito Ozaki, Toyota (JP); Kenji Uchida, Toyota (JP); Hisato Nishida, Toyota (JP)

(73) Assignee: Toyota Jidosha Kabushiki Kaisha, Toyota (JP)

(*) Notice: Subject to any disclaimer, the term of this patent is extended or adjusted under 35 U.S.C. 154(b) by 304 days.

(21) Appl. No.: 12/224,658

(22) PCT Filed: Apr. 23, 2007

(86) PCT No.: PCT/JP2007/059287
§ 371 (c)(1),
(2), (4) Date: Sep. 3, 2008

(87) PCT Pub. No.: WO2007/123279
PCT Pub. Date: Nov. 1, 2007

(65) Prior Publication Data
US 2009/0108674 A1    Apr. 30, 2009

(30) Foreign Application Priority Data

Apr. 24, 2006    (JP) .................................. 2006-119386

(51) Int. Cl.
*B60L 1/00* (2006.01)

(52) U.S. Cl. .................................................... 307/10.1
(58) Field of Classification Search ................... 307/10.1
See application file for complete search history.

(56) References Cited

U.S. PATENT DOCUMENTS

| 5,369,540 | A | 11/1994 | Konrad et al. |
| 6,002,221 | A * | 12/1999 | Ochiai et al. .................. 318/139 |
| 6,923,279 | B2 | 8/2005 | Shimane et al. |
| 2003/0029654 | A1 | 2/2003 | Shimane et al. |

FOREIGN PATENT DOCUMENTS

| JP | A-07-505997 | 6/1995 |
| JP | A-10-144194 | 5/1998 |
| JP | A-2000-134707 | 5/2000 |
| JP | A-2000-270561 | 9/2000 |
| JP | A-2003-061209 | 2/2003 |
| JP | A-2004-014242 | 1/2004 |
| JP | A-2004-032903 | 1/2004 |
| JP | A-2005-276565 | 10/2005 |

* cited by examiner

Primary Examiner — Jared J Fureman
Assistant Examiner — Dru M Parries
(74) Attorney, Agent, or Firm — Oliff & Berridge, PLC (57) ABSTRACT

When an ignition key is turn ON, an ECU drives a bidirectional DC/DC converter to charge a capacitor to a voltage Vth1. The ECU turns on a first relay only and diagnoses whether or not a second relay, which is off, is welded, based on a change in a voltage VL at that time. After the diagnosis on welding, the ECU turns on the second relay, and the capacitor is charged to a voltage level of a main power storage device.

14 Claims, 7 Drawing Sheets

POWER SUPPLY CONTROL DEVICE AND METHOD OF DETECTING ABNORMALITY OF RELAY

TECHNICAL FIELD

The present invention relates to a power supply control device and a method of detecting abnormality of a relay, and in particular to a technique of a method of detecting abnormality of a system main relay.

BACKGROUND ART

Japanese Patent Laying-Open No. 2004-14242 discloses a technique of diagnosing abnormality of a control relay (system main relay) in a power supply circuit. A power supply control system disclosed in this publication includes a battery, first and second relays connected to positive and negative electrode sides of the battery, respectively, and a voltmeter measuring a voltage across terminals of the first and the second relays each provided on a side opposite to the battery.

When the system is started up, with only one of the first and the second relays turned on, it is diagnosed whether or not the relay in an off state is welded, based on the voltage from the voltmeter.

However, Japanese Patent Laying-Open No. 2004-14242 does not consider an inrush current that may flow when a relay is turned on. The power supply control system disclosed in the above publication has no precharge circuit such as a limiting resistor for preventing an inrush current. Therefore, when one of the first and the second relays is turned on, if the other relay is welded, a circuit is formed between the battery and a capacitor, and an inrush current may flow therethrough. Thereby, even the normal relay may also become welded.

On the other hand, it is not preferable from the viewpoints of cost reduction and downsizing of the system and the like to provide a dedicated precharge circuit for precharging the capacitor.

DISCLOSURE OF THE INVENTION

The present invention has been made to solve the aforementioned problems, and one object of the present invention is to provide a power supply control device capable of diagnosing whether or not a system main relay is welded, without having a precharge circuit and without generating an inrush current.

Another object of the present invention is to provide a method of detecting abnormality capable of diagnosing whether or not a system main relay is welded, without providing a precharge circuit and without generating an inrush current.

According to the present invention, a power supply control device includes a direct current power supply, first and second relays, a capacitive element, a bidirectional converter, a voltage detection device, and a control device. The first relay is connected between one electrode of the direct current power supply and a first power line. The second relay is connected between the other electrode of the direct current power supply and a second power line. The capacitive element is connected between the first and second power lines. The bidirectional converter is connected between the first and second power lines in parallel with the capacitive element. The voltage detection device detects a voltage across the capacitive element. The control device controls the bidirectional converter to charge (precharge) the capacitive element using the bidirectional converter. The control device divides charging (precharging) of the capacitive element into two stages, and controls the bidirectional converter to charge the capacitive element to a prescribed voltage lower than a voltage of the direct current power supply in a first stage. Thereafter, the control device turns the first and second relays to an off state and an on state, respectively, and determines whether or not the first relay is welded based on a change in a detected voltage value from the voltage detection device at that time.

Preferably, the prescribed voltage is set to a value higher than an upper limit of a voltage at which an inrush current is generated due to a voltage difference between the direct current power supply and the capacitive element when both of the first and second relays are turned on.

Preferably, when the detected voltage value exceeds a first threshold voltage set between the prescribed voltage and the voltage of the direct current power supply, the control device determines that the first relay is welded.

Preferably, the control device turns the first and second relays to an off state and an on state, respectively, controls the bidirectional converter again to charge the capacitive element to the voltage of the direct current power supply, and determines, when a time period taken for the detected voltage value to reach the voltage of the direct current power supply is shorter than a defined threshold time period, that the first relay is welded.

Preferably, after the capacitive element is charged (precharged) to a level of the voltage of the direct current power supply in a second stage subsequent to the first stage, the control device turns the first and second relays to an on state and an off state, respectively, controls the bidirectional converter to discharge the capacitive element, and further determines whether or not the second relay is welded based on a change in the detected voltage value at that time.

More preferably, when the detected voltage value does not fall below a second threshold voltage set to a level lower than the voltage of the direct current power supply, the control device determines that the second relay is welded.

Further, according to the invention, a method of detecting abnormality of a relay is a method of detecting abnormality of a relay in a power supply device. The power supply device includes a direct current power supply, first and second relays, a capacitive element, a bidirectional converter, and a voltage detection device. The first relay is connected between one electrode of the direct current power supply and a first power line. The second relay is connected between the other electrode of the direct current power supply and a second power line. The capacitive element is connected between the first and second power lines. The bidirectional converter is connected between the first and second power lines in parallel with the capacitive element. The voltage detection device detects a voltage across the capacitive element. The method of detecting abnormality includes the steps of driving the bidirectional converter to charge (precharge) the capacitive element to a prescribed voltage lower than a voltage of the direct current power supply, turning the first and second relays to an off state and an on state, respectively, after the capacitive element is charged to the prescribed voltage, and determining whether or not the first relay is welded based on a change in a detected voltage value from the voltage detection device.

Preferably, the prescribed voltage is set to a value higher than an upper limit of a voltage at which an inrush current is generated due to a voltage difference between the direct current power supply and the capacitive element when both of the first and second relays are turned on.

Preferably, in the step of determining whether or not the first relay is welded, when the detected voltage value exceeds a first threshold voltage set between the prescribed voltage and the voltage of the direct current power supply, it is determined that the first relay is welded.

Preferably, the method of detecting abnormality further includes the step of turning the first and second relays to an off state and an on state, respectively, and controlling the bidirectional converter again to charge the capacitive element to the voltage of the direct current power supply. In the step of determining whether or not the first relay is welded, when a time period taken for the detected voltage value to reach the voltage of the direct current power supply is shorter than a defined threshold time period, it is determined that the first relay is welded.

Preferably, the method of detecting abnormality further includes the steps of charging (precharging) the capacitive element to a level of the voltage of the direct current power supply after the step of determining whether or not the first relay is welded, turning the first and second relays to an on state and an off state, respectively, after the capacitive element is charged, driving the bidirectional converter to discharge the capacitive element, and determining whether or not the second relay is welded based on a change in the detected voltage value when the capacitive element is discharged.

More preferably, in the step of determining whether or not the second relay is welded, when the detected voltage value does not fall below a second threshold voltage set to a level lower than the voltage of the direct current power supply, it is determined that the second relay is welded.

In the present invention, the bidirectional converter is connected between the first and second power lines in parallel with the capacitive element. Charging (precharging) of the capacitive element is divided into two stages. The capacitive element is charged to a prescribed voltage lower than the voltage of the direct current power supply using the bidirectional converter in the first stage, and thereafter it is determined whether or not the first relay is welded. As a result, a voltage difference between the direct current power supply and the capacitive element during diagnosis on welding is suppressed, and generation of an inrush current is prevented.

Consequently, according to the present invention, whether or not a relay is welded can be diagnosed without providing a precharge circuit such as a limiting resistor, and without generating an inrush current.

BEST MODES FOR CARRYING OUT THE INVENTION

Hereinafter, embodiments of the present invention will be described in detail with reference to the drawings, in which identical or corresponding parts will be designated by the same reference numerals, and the description thereof will not be repeated.

First Embodiment

Figure 1:
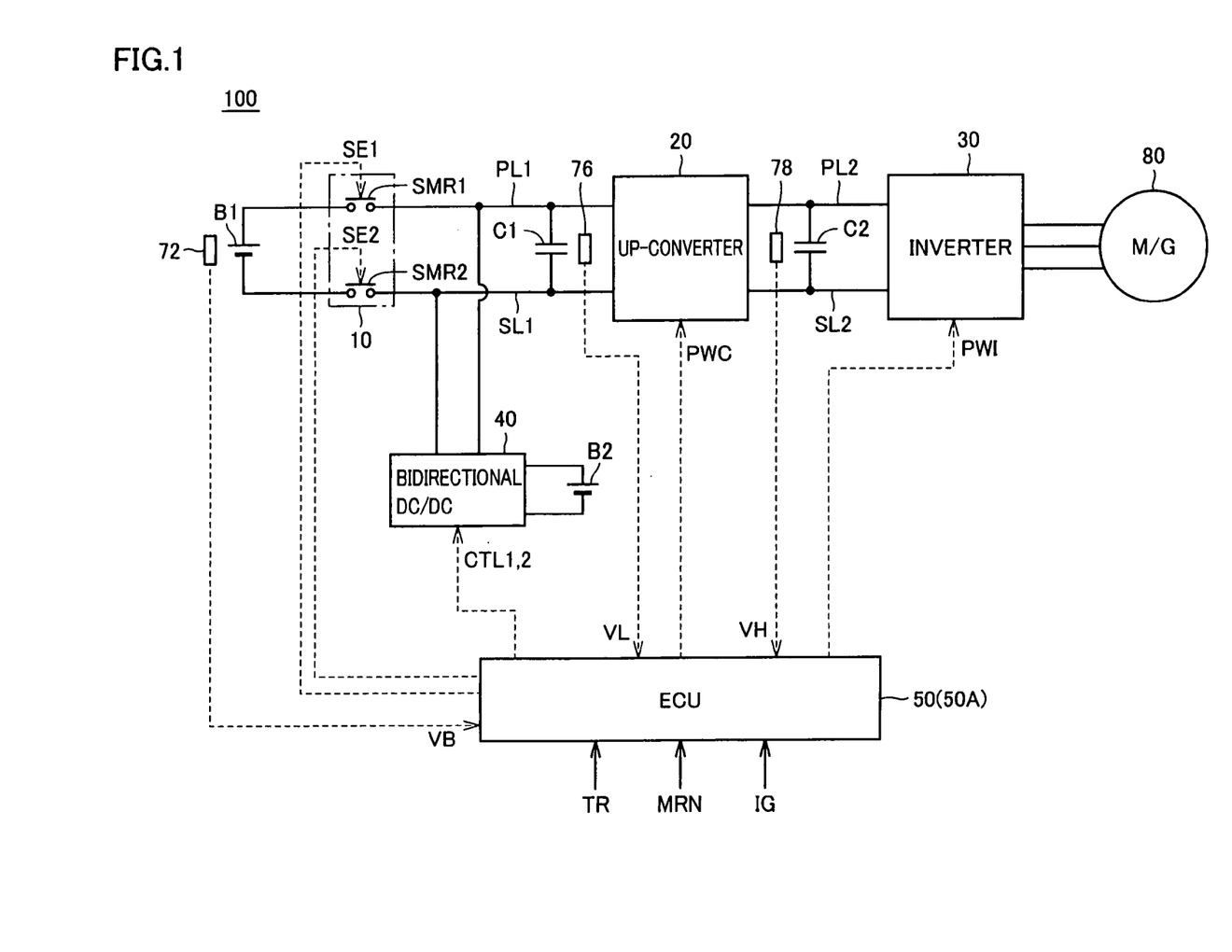
FIG. 1 is an entire block diagram of a load driving device including a power supply control device in accordance with a first embodiment of the present invention.

FIG. 1 is an entire block diagram of a load driving device including a power supply control device in accordance with a first embodiment of the present invention. Referring to FIG. 1, a load driving device 100 includes a main power storage device B1, a system main relay 10, an up-converter 20, an inverter 30, power supply lines PL1 and PL2, ground lines SL1 and SL2, capacitors C1 and C2, a bidirectional DC/DC converter 40, an auxiliary equipment power storage device B2, an ECU (Electronic Control Unit) 50, and voltage sensors 72, 76, and 78.

Load driving device 100 is mounted in an electrically driven vehicle such as a hybrid vehicle or an electric vehicle. A motor generator 80 driven by load driving device 100 is coupled with drive wheels (not shown), and mounted in a vehicle as an electric motor driving the drive wheels. Motor generator 80 may be coupled with an engine (not shown), and mounted in a hybrid vehicle as a device operating as an electric motor capable of starting the engine and also operating as a generator driven by the engine.

System main relay 10 includes relays SMR1 and SMR2. Relay SMR1 is connected between a positive electrode of main power storage device B1 and power supply line PL1. Relay SMR2 is connected between a negative electrode of main power storage device B1 and ground line SL1.

Capacitor C1 is connected between power supply line PL1 and ground line SL1. Bidirectional DC/DC converter 40 is connected between power supply line PL1 and ground line SL1 in parallel with capacitor C1. Auxiliary equipment power storage device B2 is connected to bidirectional DC/DC converter 40.

Up-converter 20 is connected between a pair of power supply line PL1 and ground line SL1 and a pair of power supply line PL2 and ground line SL2. Capacitor C2 is connected between power supply line PL2 and ground line SL2.

Inverter 30 includes a U-phase arm, a V-phase arm, and a W-phase arm (not shown) connected in parallel between power supply line PL2 and ground line SL2. Connection points between upper arms and lower arms in the U-phase arm, the V-phase arm, and the W-phase arm are connected to a U-phase coil, a V-phase coil, and a W-phase coil (not shown) of motor generator 80, respectively.

Main power storage device B1 is a chargeable and dischargeable direct current power supply, and formed for example of a secondary battery such as a nickel hydride battery, a lithium ion battery, or the like. Main power storage device B1 supplies electric power to capacitor C1 via system main relay 10. Main power storage device B1 also supplies electric power to bidirectional DC/DC converter 40 via system main relay 10. Main power storage device B1 is charged by receiving electric power supplied from up-converter 20 to power supply line PL1. A high-capacity capacitor may be used as main power storage device B1.

Voltage sensor 72 detects a voltage VB of main power storage device B1, and supplies the detected voltage VB to ECU 50. When a signal SE1 from ECU 50 is activated, relay SMR1 connects power supply line PL1 with the positive electrode of main power storage device B1. When a signal SE2 from ECU 50 is activated, relay SMR2 connects ground line SL1 with the negative electrode of main power storage device B1. Capacitor C1 smoothes voltage variations between power supply line PL1 and ground line SL1. Voltage sensor 76 detects a voltage VL across capacitor C1, and supplies the detected voltage VL to ECU 50.

Up-converter 20 up-converts a voltage supplied from capacitor C1 based on a signal PWC from ECU 50, and supplies the up-converted voltage to capacitor C2. Up-converter 20 also down-converts a voltage supplied from capacitor C2 based on signal PWC from ECU 50, and supplies the down-converted voltage to capacitor C1.

Capacitor C2 smoothes voltage variations between power supply line PL2 and ground line SL2. Voltage sensor 78 detects a voltage VH across capacitor C2, and supplies the detected voltage VH to ECU 50.

Inverter 30 converts a direct current voltage supplied from capacitor C2 into an alternating current voltage and supplies the alternating current voltage to motor generator 80, based on a signal PWI from ECU 50. Inverter 30 also converts an alternating current voltage generated by motor generator 80 into a direct current voltage and supplies the direct current voltage to capacitor C2, based on signal PWI from ECU 50.

Bidirectional DC/DC converter 40 down-converts a direct current voltage supplied from power supply line PL1 to a voltage level for auxiliary equipment and supplies the down-converted voltage to auxiliary equipment power storage device B2, based on a signal CTL1 from ECU 50. Bidirectional DC/DC converter 40 also up-converts a direct current voltage supplied from auxiliary equipment power storage device B2 and supplies the up-converted voltage to power supply line PL1, based on a signal CTL2 from ECU 50.

Auxiliary equipment power storage device B2 is a chargeable and dischargeable direct current power supply, and formed for example of a lead battery. Auxiliary equipment power storage device B2 is charged by bidirectional DC/DC converter 40. Further, auxiliary equipment power storage device B2 supplies electric power to bidirectional DC/DC converter 40.

ECU 50 receives voltages VL and VH from voltage sensors 76 and 78, respectively, and receives a torque control value TR and a motor revolution number MRN of motor generator 80 from an external ECU not shown. Based on these signals, ECU 50 generates signal PWC for driving up-converter 20, and supplies the generated signal PWC to up-converter 20.

ECU 50 also generates signal PWI for driving motor generator 80 and supplies the generated signal PWI to inverter 30, based on torque control value TR and a motor current of motor generator 80 and voltage VH. The motor current of motor generator 80 is detected by a current sensor not shown.

Further, ECU 50 generates signal CTL1 for driving bidirectional DC/DC converter 40, and supplies the generated signal CTL1 to bidirectional DC/DC converter 40. Thereby, auxiliary equipment power storage device B2 is charged by electric power from main power storage device B1 or electric power generated by motor generator 80.

Further, when ECU 50 determines that an ignition key (not shown) is turned to an ON position based on a signal IG indicating a position of the ignition key, ECU 50 generates signal CTL2 for driving bidirectional DC/DC converter 40, and supplies the generated signal CTL2 to bidirectional DC/DC converter 40. Thereby, when a system is started up, capacitor C1 is charged (precharged) from auxiliary equipment power storage device B2 using bidirectional DC/DC converter 40.

On this occasion, ECU 50 charges (precharges) capacitor C1 in two stages, through a method described later. After performing the first stage charging, ECU 50 diagnoses whether or not relay SR2 is welded. Then, after the diagnosis on welding is completed, the second stage charging is performed.

Further, when ECU 50 determines that the ignition key is turned to an OFF position based on signal IG, ECU 50 generates signal CTL1 for driving bidirectional DC/DC converter 40, and supplies the generated signal CTL1 to bidirectional DC/DC converter 40. Thereby, when the system is stopped, electric charge in capacitor C1 is discharged to auxiliary equipment power storage device B2 using bidirectional DC/DC converter 40.

On this occasion, ECU 50 diagnoses whether or not relay SMR1 is welded in conjunction with the discharge of capacitor C1 using bidirectional DC/DC converter 40, through a method described later.

Figure 2:
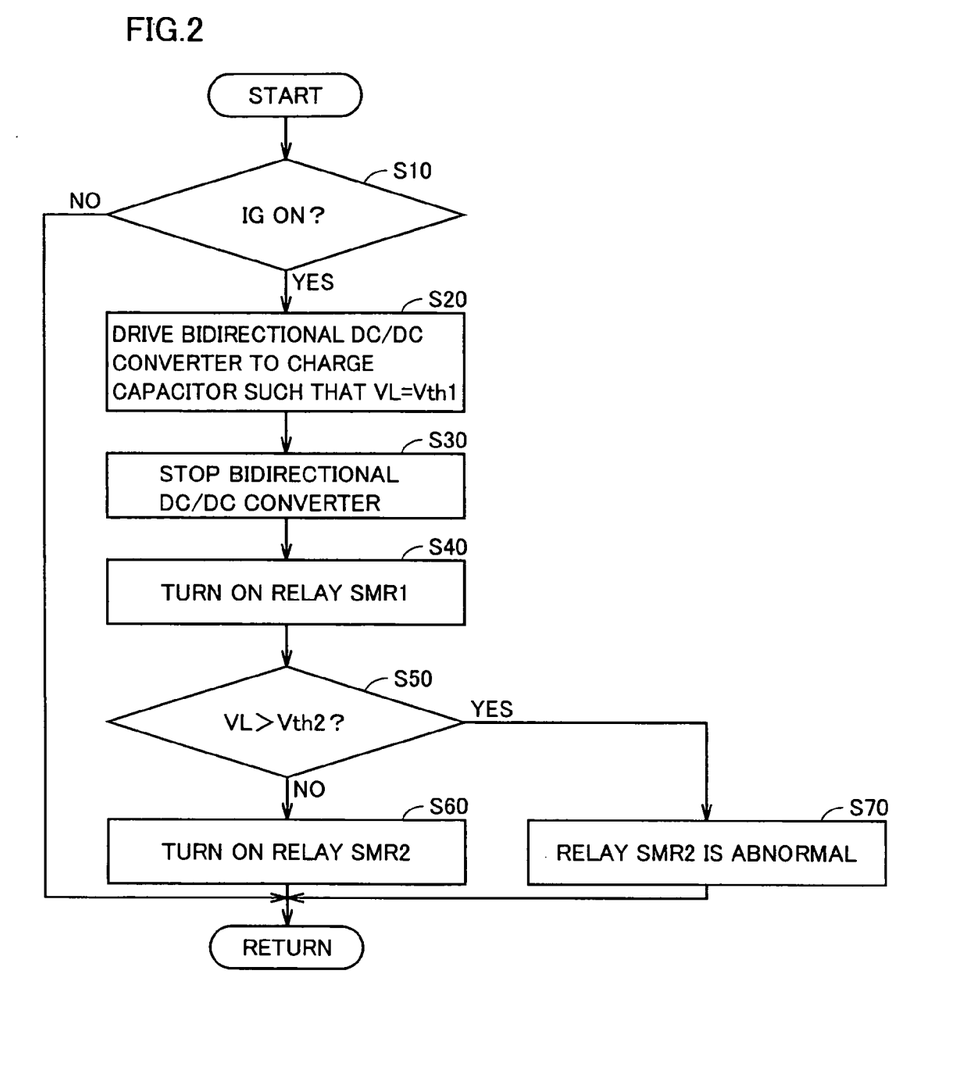
FIG. 2 is a flow chart of control by an ECU shown in FIG. 1 when a system is started up.

FIG. 2 is a flow chart of control by ECU 50 shown in FIG. 1 when the system is started up. The process of the flow chart is invoked from a main routine and executed at regular time intervals or every time when a prescribed condition is satisfied.

Referring to FIG. 2, ECU 50 determines whether or not the ignition key is turned to the ON position based on signal IG from the ignition key (step S10). When ECU 50 determines that the ignition key is not turned to the ON position (NO in step S10), ECU 50 terminates the process without performing a series of subsequent steps.

When ECU 50 determines in step S10 that the ignition key is turned to the ON position (YES in step S10), ECU 50 generates signal CTL2 and supplies it to bidirectional DC/DC converter 40. Thereby, bidirectional DC/DC converter 40 is driven, and charging (precharging) of capacitor C1 from auxiliary equipment power storage device B2 is started. On this occasion, relays SMR1 and SMR2 of system main relay 10 are both off, and no electric charge is supplied from main power storage device B1to capacitor C1. Then, ECU 50 activates signal CTL2 until voltage VL reaches a preset voltage Vth1 (step S20).

Voltage Vth1 is determined based on an inrush current specification of system main relay 10. Specifically, a level of voltage VL capable of turning on system main relay 10 can be determined based on a specification for an inrush current that may damage system main relay 10 and circuit impedance. Accordingly, voltage Vth1 is determined to be higher than the voltage capable of turning on the relay.

When voltage VL reaches voltage Vth1, ECU 50 deactivates signal CTL2 to stop bidirectional DC/DC converter 40 (step S30). Next, ECU 50 activates signal SE1 to turn on relay SMR1 (step S40). Then, ECU 50 determines whether or not voltage VL exceeds a voltage Vth2 (step S50). Voltage Vth2 is a threshold voltage for determining whether or not relay SMR2, which is off, is welded. Voltage Vth2 is set between voltage Vth1 and voltage VB.

When it is determined in step S50 that voltage VL is not more than voltage Vth2 (NO in step S50), it is determined that relay SMR2 is off in a normal manner, and ECU 50 activates signal SE2 to turn on relay SMR2 (step S60). Thereby, electric charge is supplied from main power storage device B1 to capacitor C1, and capacitor C1 is charged to voltage VB.

No inrush current is generated when relay SMR2 is turned on in step S60, because voltage VL (voltage Vth1) is higher than the voltage capable of turning on the relay. Before relay SMR2 is turned on in step S60, bidirectional DC/DC converter 40 may be driven to charge capacitor C1 to voltage VB.

On the other hand, when it is determined in step S50 that voltage VL exceeds voltage Vth2 (YES in step S50), it is determined that relay SMR2, which is off, is welded, and ECU 50 determines that relay SMR2 is abnormal (step S70).

Figure 3:
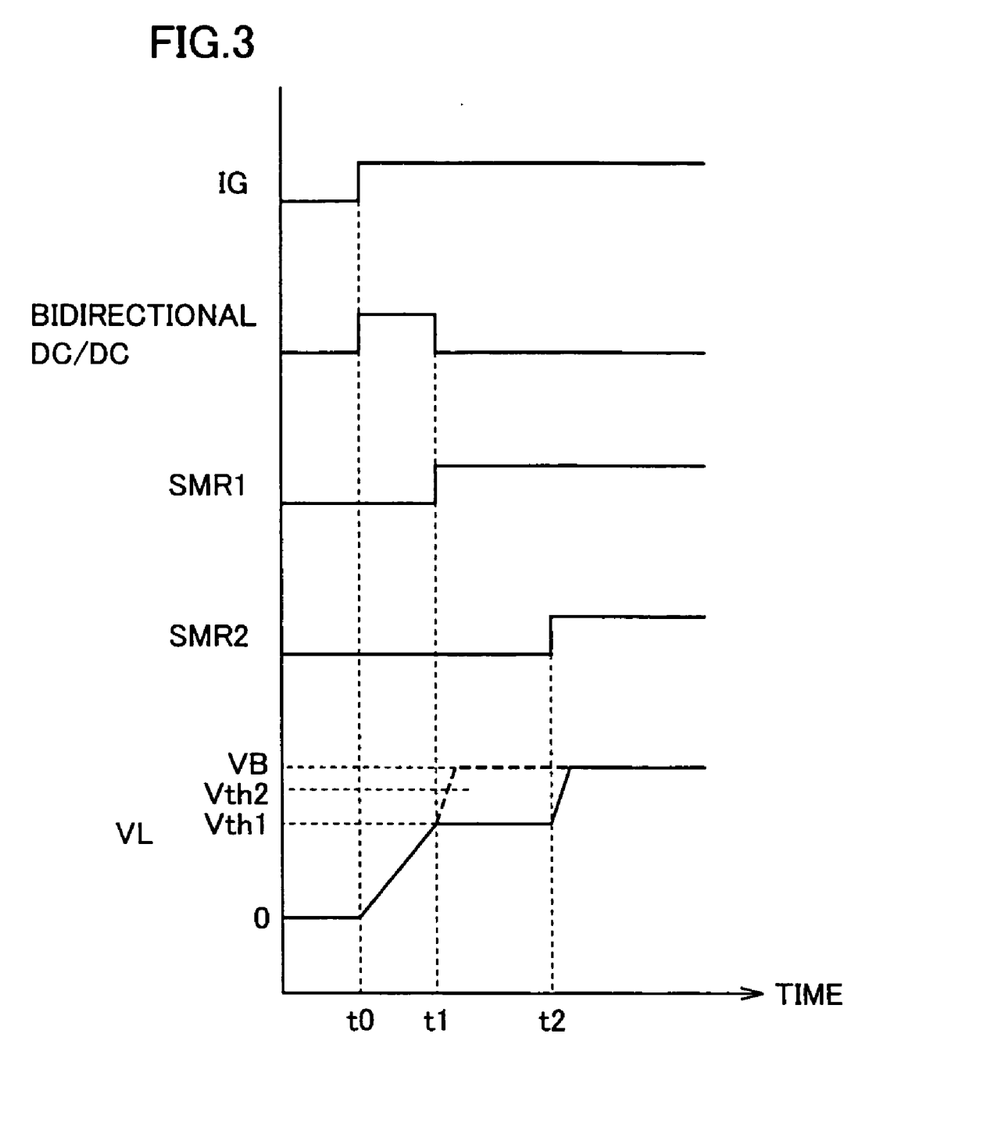
FIG. 3 is a timing chart of main signals and a voltage VL when the system is started up.

FIG. 3 is a timing chart of the main signals and voltage VL when the system is started up. Referring to FIG. 3, when the ignition key is turned to the ON position at a time point t0, bidirectional DC/DC converter 40 is driven, and charging (precharging) of capacitor C1 from auxiliary equipment power storage device B2 is started.

When voltage VL reaches voltage Vth1 at a time point t1, bidirectional DC/DC converter 40 is once stopped, and relay SMR1 is turned on. On this occasion, if relay SMR2 is off in a normal manner, no electric charge is supplied from main power storage device B1 to capacitor C1, and thus there is no increase in voltage VL (a solid line) even when relay SMR1 is turned on.

On the other hand, if relay SMR2 is welded, electric charge is supplied from main power storage device B1 to capacitor C1 when relay SMR1 is turned on, causing an increase in voltage VL (a dashed line). When voltage VL exceeds voltage Vth2, it is determined that relay SMR2 is abnormal.

When it is determined that relay SMR2 is normal, relay SMR2 is turned on at a time point t2, and capacitor C1 is charged (precharged) to voltage VB.

Whether or not relay SMR1 is welded is diagnosed when the system is stopped.

Figure 4:
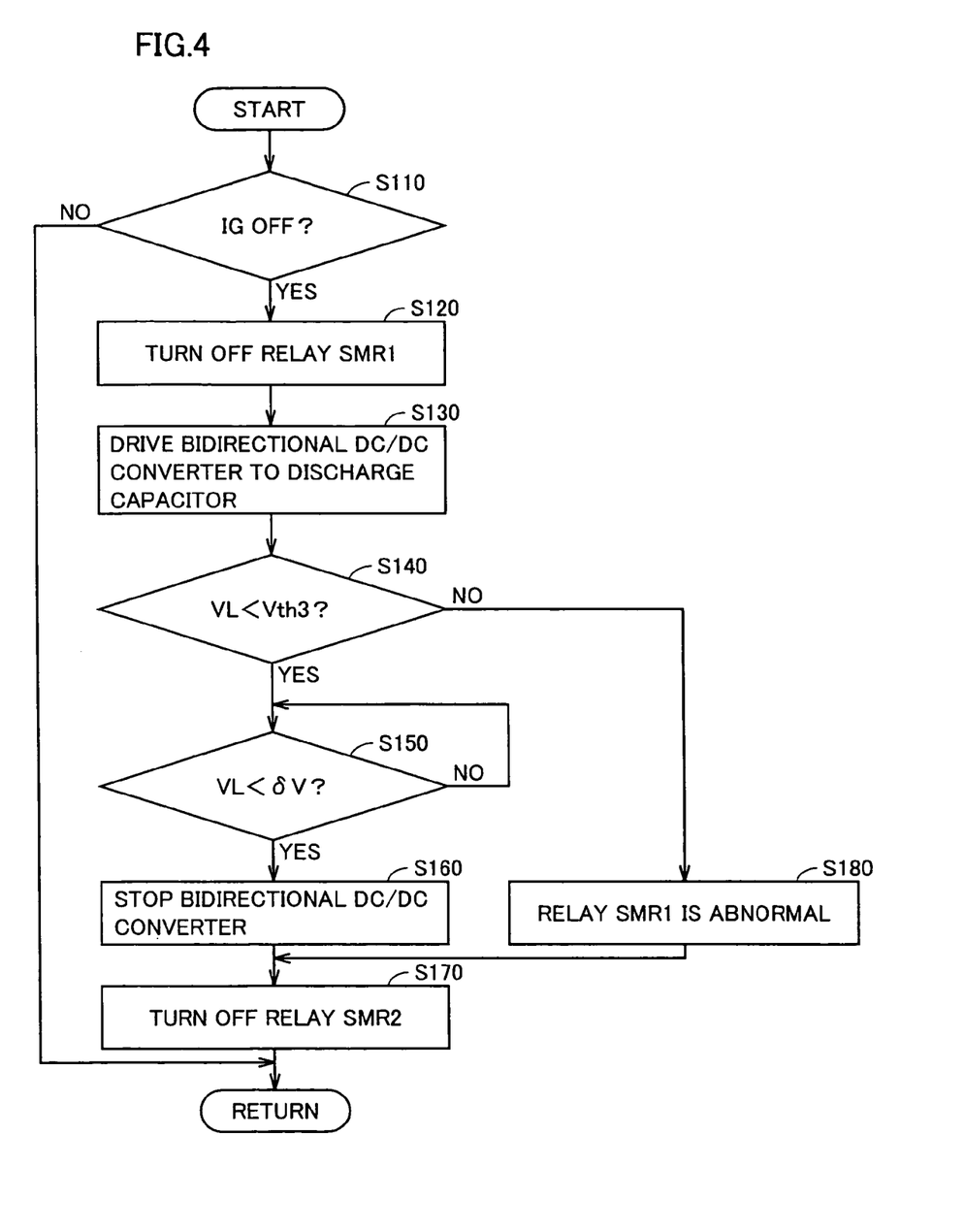
FIG. 4 is a flow chart of control by the ECU shown in FIG. 1 when the system is stopped.

FIG. 4 is a flow chart of control by ECU 50 shown in FIG. 1 when the system is stopped. The process of the flow chart is also invoked from the main routine and executed at regular time intervals or every time when a prescribed condition is satisfied.

Referring to FIG. 4, ECU 50 determines whether or not the ignition key is turned to the OFF position based on signal IG (step S110). When ECU 50 determines that the ignition key is not turned to the OFF position (NO in step S110), ECU 50 terminates the process without performing a series of subsequent steps.

When ECU 50 determines in step S110 that the ignition key is turned to the OFF position (YES in step S110), ECU 50 deactivates signal SE1 to turn off relay SMR1 (step S120). Next, ECU 50 generates signal CTL1 and supplies it to bidirectional DC/DC converter 40. Thereby, bidirectional DC/DC converter 40 is driven, and discharging from capacitor C1 to auxiliary equipment power storage device B2 is started (step S130).

During the discharging from capacitor C1, ECU 50 determines whether or not voltage VL falls below a voltage Vth3 (step S140). Voltage Vth3 is a threshold voltage for determining whether or not relay SMR1, which is off, is welded. Voltage Vth3 is set to a level lower than voltage VB.

When it is determined in step S140 that voltage VL falls below voltage Vth3 (YES in step S140), ECU 50 determines that relay SMR1 is off in a normal manner. Then, when voltage VL falls below a voltage δV indicating that capacitor C1 has been fully discharged (YES in step S150), ECU 50 deactivates signal CTL1 to stop bidirectional DC/DC converter 40 (step S160). Thereafter, ECU 50 deactivates signal SE2 to turn off relay SMR2 (step S170), completing a series of steps.

On the other hand, when it is determined in step S140 that voltage VL does not fall below voltage Vth3 (NO in step S140), it is determined that relay SMR1, which is off, is welded, and ECU 50 determines that relay SMR1 is abnormal (step S180). Then, ECU 50 advances the process to step S170.

Figure 5:
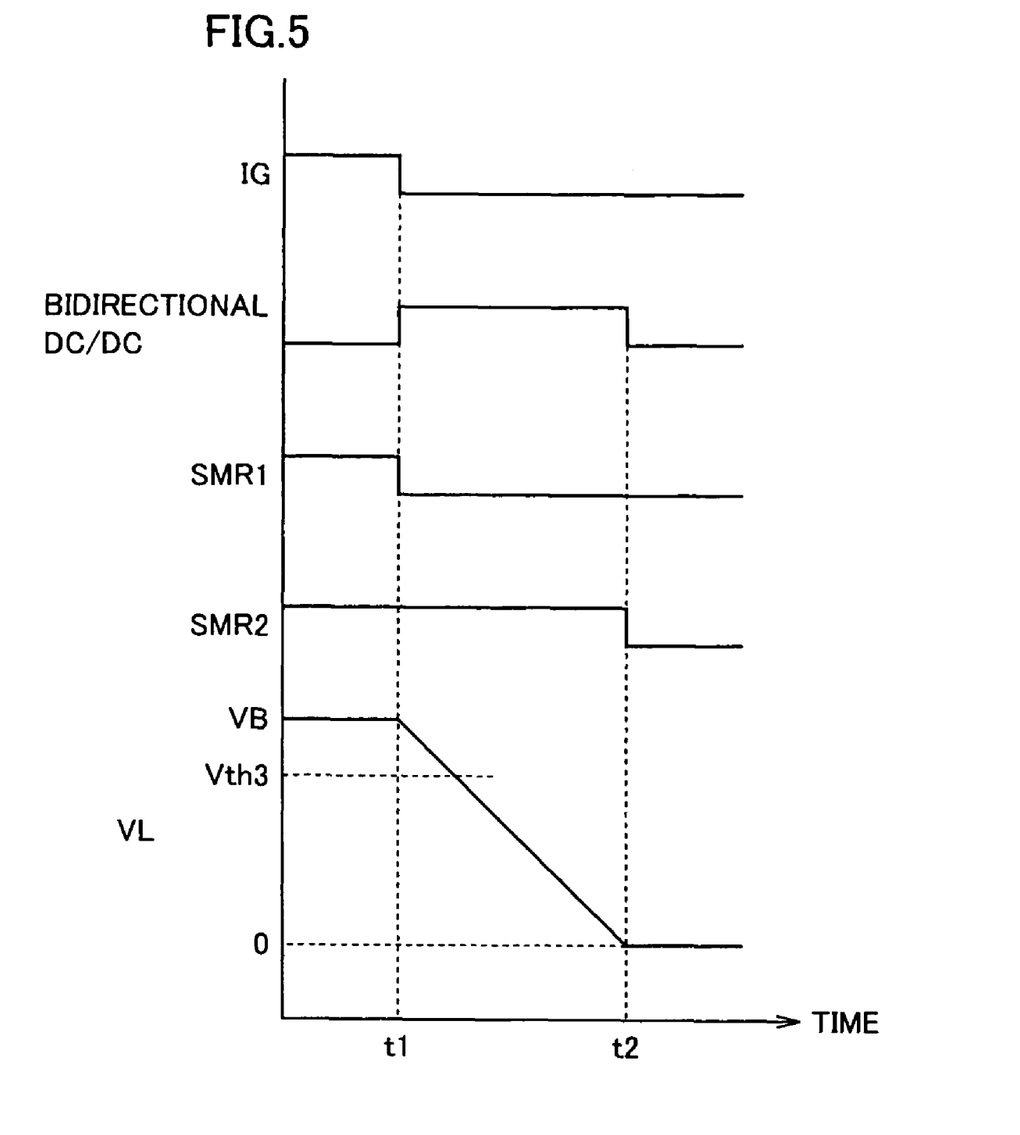
FIG. 5 is a timing chart of the main signals and voltage VL when the system is stopped.

FIG. 5 is a timing chart of the main signals and voltage VL when the system is stopped. Referring to FIG. 5, when the ignition key is turned to the OFF position at a time point t1, relay SMR1 is turned off. Then, bidirectional DC/DC converter 40 is driven, and discharging from capacitor C1 to auxiliary equipment power storage device B2 is started.

If relay SMR1 is off in a normal manner, voltage VL is decreased after time point t1, and when voltage VL falls below voltage Vth3, it is determined that relay SMR1 is normal. Thereafter, when voltage VL falls below voltage δV (not shown) at a time point t2, bidirectional DC/DC converter 40 is stopped, and relay SMR2 is turned off.

As described above, in the first embodiment, precharging of capacitor C1 is divided into two stages. Capacitor C1 is charged to voltage Vth1 using bidirectional DC/DC converter 40 in the first stage, and thereafter it is diagnosed whether or not relay SMR2 is welded. As a result, a voltage difference between main power storage device B1 and capacitor C1 during the diagnosis on welding is suppressed, and generation of an inrush current is prevented. Consequently, according to the first embodiment, whether or not system main relay 10 is welded can be diagnosed without providing a precharge circuit such as a limiting resistor, and without generating an inrush current.

Further, according to the first embodiment, since capacitor C1 is discharged using bidirectional DC/DC converter 40 when the system is stopped, capacitor C1 can be discharged quickly. Furthermore, since electric charge is discharged to auxiliary equipment power storage device B2, waste of electric power can be suppressed. In addition, whether or not the other relay SMR1 is welded can be diagnosed in conjunction with the discharge of capacitor C1 using bidirectional DC/DC converter 40.

Second Embodiment

A second embodiment has a configuration similar to that of the first embodiment except for the method of determining whether or not the relay is welded when the system is started.

Figure 6:
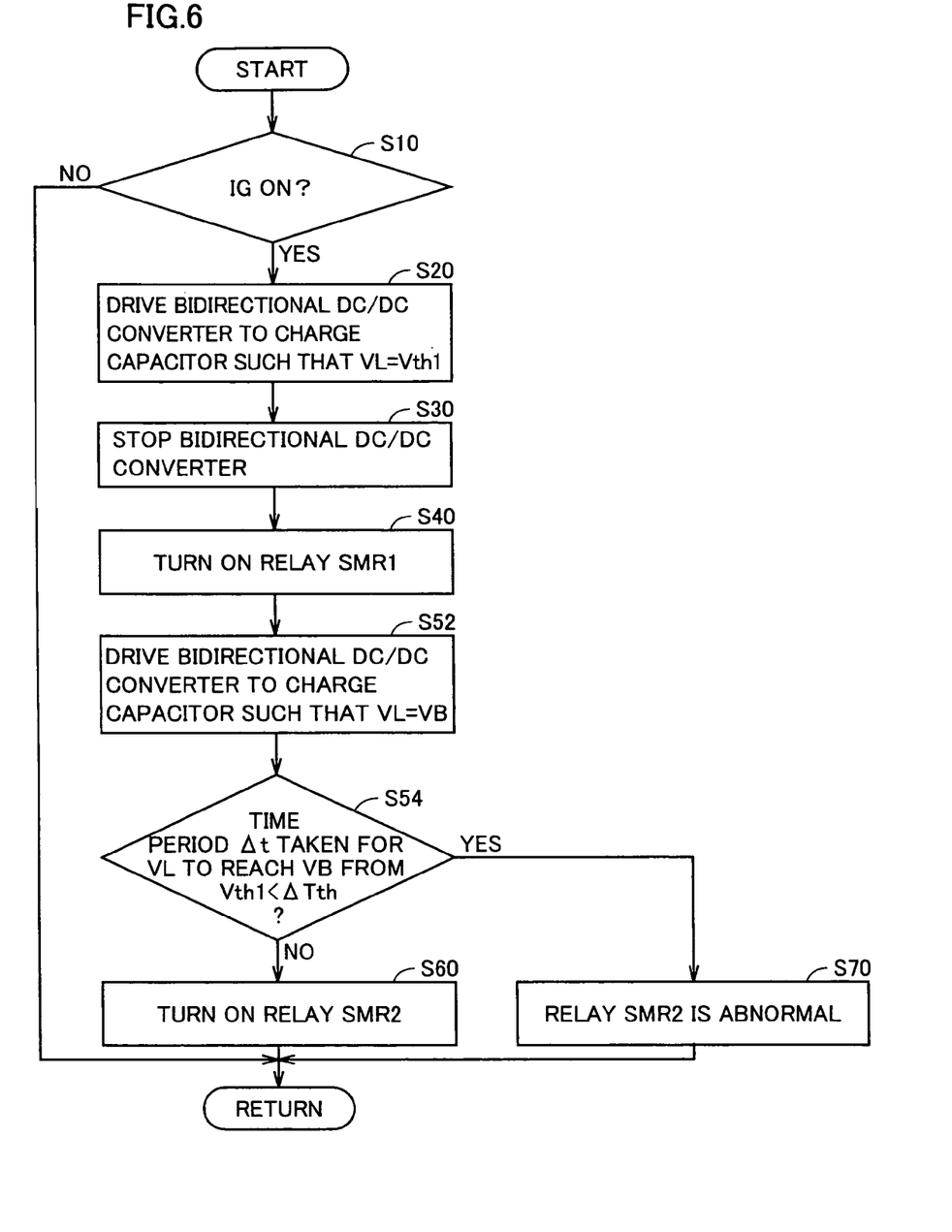
FIG. 6 is a flow chart of control by an ECU in a second embodiment when the system is started up.

FIG. 6 is a flow chart of control by an ECU 50A in the second embodiment when the system is started up. The process of the flow chart is also invoked from the main routine and executed at regular time intervals or every time when a prescribed condition is satisfied.

Referring to FIG. 6, the process shown in the flow chart includes steps S52 and S54 instead of step S50 in a series of steps shown in FIG. 2. Specifically, when the first stage precharging is performed in step S20 and relay SMR1 is turned on in step S40, ECU 50A generates signal CTL2, supplies it to bidirectional DC/DC converter 40, and activates signal CTL2 until when voltage VL reaches voltage VB (step S52).

During the second stage precharging in step S52, ECU 50A measures a time period Δt from when relay SMR1 is turned on to when voltage VL reaches voltage VB. Then, ECU 50A determines whether or not time period Δt is shorter than a preset threshold time period ΔTth (step S54).

Threshold time period ΔTth is set to be shorter than a charging time period expected to take when capacitor C1 is charged from voltage Vth1 to voltage VB using bidirectional DC/DC converter 40. For example, taking a measurement error of time period Δt into consideration, threshold time period ΔTth is set to be shorter than the expected charging time period by the error.

When it is determined in step S54 that time period Δt is not less than threshold time period ΔTth (NO in step S54), it is determined that relay SMR2 is off in a normal manner, and ECU 50A advances the process to step S60.

On the other hand, when it is determined in step S54 that time period Δt is shorter than threshold time period ΔTth (YES in step S54), it is determined that relay SMR2, which is off, is welded and thereby electric charge is supplied from main power storage device B1 to capacitor C1 and causes an increase in voltage VL in a short period of time. Then, ECU 50A advances the process to step S70.

After the ignition key is turned on, capacitor C1 may be precharged continuously until voltage VL reaches voltage VB, and relay SMR1 may be turned on when voltage VL reaches voltage Vth1. However, taking a delay in the operation of relay SMR1 into consideration, it is preferable to once precharge capacitor C1 to voltage Vth1, turn on relay SMR1, and start the second stage precharging, as described above.

Other functions of ECU 50A are the same as those of ECU 50 in the first embodiment.

Figure 7:
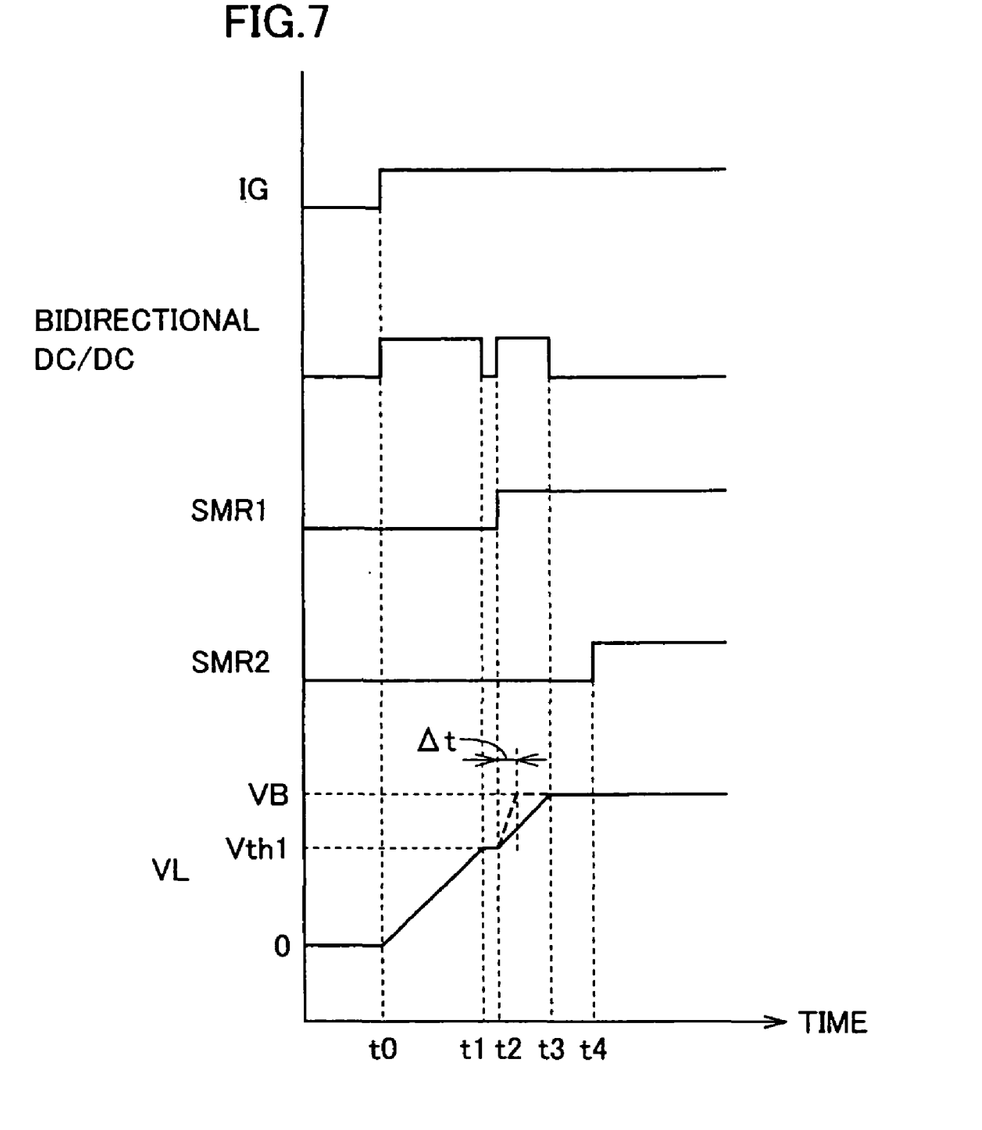
FIG. 7 is a timing chart of the main signals and voltage VL when the system is started up in the second embodiment.

FIG. 7 is a timing chart of the main signals and voltage VL when the system is started up in the second embodiment. Referring to FIG. 7, when the ignition key is turned to the ON position at a time point t0, bidirectional DC/DC converter 40 is driven, and charging (precharging) of capacitor C1 from auxiliary equipment power storage device B2 is started.

When voltage VL reaches voltage Vth1 at a time point t1, bidirectional DC/DC converter 40 is once stopped. Then, relay SMR1 is turned on at a time point t2, and bidirectional DC/DC converter 40 is driven again. On this occasion, if relay SMR2 is off in a normal manner, capacitor C1 is charged by bidirectional DC/DC converter 40, and charging of capacitor C1 is terminated at a time point t3 (a solid line).

On the other hand, if relay SMR2 is welded, electric charge is supplied from main power storage device B13 to capacitor C1 when relay SMR1 is turned on, and voltage VL is immediately increased to voltage VB (a dashed line). Therefore, time period Δt from when relay SMR1 is turned on to when voltage VL reaches voltage VB is measured, and when time period Δt is significantly shorter than a time period (t3−t2) generally taken when relay SMR2 is normal, it is determined that relay SMR2 is abnormal.

Thereafter, when voltage VL reaches voltage VB at time point t3 and it is determined that relay SMR2 is normal, relay SMR2 is turned on at a time point t4.

As described above, in the second embodiment, whether or not relay SMR2 is welded is diagnosed while capacitor C1 is precharged. Specifically, in the first embodiment, precharging of capacitor C1 is stopped during the diagnosis on welding of relay SMR2, and if there is no increase in voltage VL, it is determined that relay SMR2 is normal. In contrast, in the second embodiment, whether or not relay SMR2 is welded is diagnosed based on a time period for which voltage VL is increased during the second stage precharging. Therefore, in comparison with the first embodiment, system startup time can be shortened.

Although it has been described in the embodiments described above that ECU 50 or 50A monitors voltage VL and bidirectional DC/DC converter 40 operates based on signals CTL1 and CTL2 supplied from ECU 50 or 50A, ECU 50 or 50A may set a target voltage (such as voltage Vth1 or voltage VB) for bidirectional DC/DC converter 40, and bidirectional DC/DC converter 40 may control voltage VL to be the target voltage.

Further, although it has been described in the embodiments described above that whether or not relay SMR1 is welded is diagnosed when the system is stopped, the diagnosis on welding of relay SMR1 may be performed when the system is started, subsequent to the diagnosis on welding of relay SMR2. However, since the diagnosis on welding of relay SMR1 involves discharging of capacitor C1, it is efficient to diagnose whether or not relay SMR1 is welded when the system is stopped, at which capacitor C1 is discharged, as in the embodiments described above.

Further, although it has been described in the embodiments described above that whether or not relay SMR2 is welded is diagnosed when the ignition key is turned on, and whether or not relay SMR1 is welded is diagnosed when the ignition key is turned off, the diagnosis on welding of relay SMR1 may be performed when the ignition key is turned on, and the diagnosis on welding of relay S2 is performed when the ignition key is turned off.

Further, although it has been described above that load driving device 100 includes up-converter 20, the present invention is also applicable to a load driving device not including up-converter 20.

In the above description, main power storage device B1 corresponds to a "direct current power supply" in the present invention, and capacitor C1 corresponds to a "capacitive element" in the present invention. Further, power supply line PL1 and ground line SL1 correspond to a "second power line" and a "first power line" in the present invention, respectively, and relays SMR1 and SMR2 correspond to a "second relay" and a "first relay" in the present invention, respectively. Furthermore, bidirectional DC/DC converter 40 corresponds to a "bidirectional converter" in the present invention, and ECUs 50 and 50A each correspond to a "control device" in the present invention.

It should be understood that the embodiments herein disclosed are by way of illustration in all respects and not to be taken by way of limitation. The scope of the present invention is defined not by the above description of the embodiments but by the appended claims, and is intended to include all the modifications within the meaning and the scope equivalent to those of the claims.

The invention claimed is:

1. A power supply control device, comprising:
   a direct current power supply;
   a first relay connected between one electrode of said direct current power supply and a first power line;
   a second relay connected between the other electrode of said direct current power supply and a second power line;
   a capacitive element connected between said first and second power lines;
   a bidirectional converter connected between said first and second power lines in parallel with said capacitive element;
   an auxiliary equipment power storage device connected to said bidirectional converter;
   a voltage detection device detecting a voltage across said capacitive element; and
   a control device controlling said bidirectional converter to charge said capacitive element using said bidirectional converter,
   said control device dividing charging of said capacitive element into two stages, controlling said bidirectional converter to charge said capacitive element to a prescribed voltage lower than a voltage of said direct current power supply in a first stage, thereafter turning said first and second relays to an off state and an on state, respectively, determining whether or not said first relay is welded based on a change in a detected voltage value from said voltage detection device at that time.

2. The power supply control device according to claim 1, wherein said prescribed voltage is set to a value higher than an upper limit of a voltage at which an inrush current is generated due to a voltage difference between said direct current power supply and said capacitive element when both of said first and second relays are turned on.

3. The power supply control device according to claim 1, wherein when said detected voltage value exceeds a first threshold voltage set between said prescribed voltage and the voltage of said direct current power supply, said control device determines that said first relay is welded.

4. The power supply control device according to claim 1, wherein said control device turns said first and second relays to an off state and an on state, respectively, controls said bidirectional converter again to charge said capacitive element to the voltage of said direct current power supply, and determines, when a time period taken for said detected voltage value to reach the voltage of said direct current power supply is shorter than a defined threshold time period, that said first relay is welded.

5. The power supply control device according to claim 1, wherein after said capacitive element is charged to a level of the voltage of said direct current power supply in a second stage subsequent to said first stage, said control device turns said first and second relays to an on state and an off state, respectively, controls said bidirectional converter to discharge said capacitive element, and further determines whether or not said second relay is welded based on a change in said detected voltage value at that time.

6. The power supply control device according to claim 5, wherein when said detected voltage value does not fall below a second threshold voltage set to a level lower than the voltage of said direct current power supply, said control device determines that said second relay is welded.

7. The power supply control device according to claim 1, wherein said prescribed voltage is a positive voltage value.

8. A method of detecting abnormality of a relay in a power supply device, said power supply device including:
a direct current power supply;
a first relay connected between one electrode of said direct current power supply and a first power line;
a second relay connected between the other electrode of said direct current power supply and a second power line;
a capacitive element connected between said first and second power lines;
a bidirectional converter connected between said first and second power lines in parallel with said capacitive element;
an auxiliary equipment power storage device connected to said bidirectional converter; and
a voltage detection device detecting a voltage across said capacitive element,
said method of detecting abnormality comprising the steps of:
driving said bidirectional converter to charge said capacitive element to a prescribed voltage lower than a voltage of said direct current power supply;
turning said first and second relays to an off state and an on state, respectively, after said capacitive element is charged to said prescribed voltage; and
determining whether or not said first relay is welded based on a change in a detected voltage value from said voltage detection device.

9. The method of detecting abnormality according to claim 8, wherein said prescribed voltage is set to a value higher than an upper limit of a voltage at which an inrush current is generated due to a voltage difference between said direct current power supply and said capacitive element when both of said first and second relays are turned on.

10. The method of detecting abnormality according to claim 8, wherein, in the step of determining whether or not said first relay is welded, when said detected voltage value exceeds a first threshold voltage set between said prescribed voltage and the voltage of said direct current power supply, it is determined that said first relay is welded.

11. The method of detecting abnormality according to claim 8, further comprising the step of turning said first and second relays to an off state and an on state, respectively, and controlling said bidirectional converter again to charge said capacitive element to the voltage of said direct current power supply,
wherein, in the step of determining whether or not said first relay is welded, when a time period taken for said detected voltage value to reach the voltage of said direct current power supply is shorter than a defined threshold time period, it is determined that said first relay is welded.

12. The method of detecting abnormality according to claim 8, further comprising the steps of:
charging said capacitive element to a level of the voltage of said direct current power supply after the step of determining whether or not said first relay is welded;
turning said first and second relays to an on state and an off state, respectively, after said capacitive element is charged;
driving said bidirectional converter to discharge said capacitive element; and
determining whether or not said second relay is welded based on a change in said detected voltage value when said capacitive element is discharged.

13. The method of detecting abnormality according to claim 12, wherein, in the step of determining whether or not said second relay is welded, when said detected voltage value does not fall below a second threshold voltage set to a level lower than the voltage of said direct current power supply, it is determined that said second relay is welded.

14. The method of detecting abnormality according to claim 8, wherein said prescribed voltage is a positive voltage value.

* * * * *